United States Patent [19]

Walker

[11] 4,163,161

[45] Jul. 31, 1979

[54] MOSFET CIRCUITRY WITH AUTOMATIC VOLTAGE CONTROL

[75] Inventor: Winston G. Walker, Irvine, Calif.

[73] Assignee: Addmaster Corporation, San Gabriel, Calif.

[21] Appl. No.: 634,545

[22] Filed: Nov. 24, 1975

[51] Int. Cl.² .................... H03K 17/00; G05F 1/40
[52] U.S. Cl. .................... 307/297; 307/296 R; 307/303; 323/22 R
[58] Field of Search .............. 307/297, 303, 297 A; 330/35; 323/1, 9, 22 T

[56] References Cited

U.S. PATENT DOCUMENTS

| | | | |
|---|---|---|---|
| 3,508,084 | 4/1970 | Warner, Jr. | 307/304 |
| 3,559,096 | 1/1971 | Lokerson | 323/22 T |
| 3,794,862 | 2/1974 | Jenne | 307/304 |
| 3,806,741 | 4/1974 | Smith | 307/304 |
| 4,042,843 | 8/1977 | Sikes | 307/297 |

*Primary Examiner*—Stanley D. Miller, Jr.
*Assistant Examiner*—B. P. Davis
*Attorney, Agent, or Firm*—Fred N. Schwend

[57] ABSTRACT

An automatic voltage regulating system for an integrated circuit having a plurality of enhancement mode metal oxide semiconductor field effect transistors on a common semiconductor crystal, the regulation system including a group of series connected metal oxide semiconductor field effect transistors on the same crystal, wherein the combined threshold voltage of such regulating transistors forms a reference to control the bias voltage for the remaining transistors.

7 Claims, 4 Drawing Figures

MOSFET CIRCUITRY WITH AUTOMATIC VOLTAGE CONTROL

BACKGROUND OF THE INVENTION

1. Field of the Invention

This invention relates to integrated circuits incorporating MOSFET (metal oxide semiconductor field effect transistor) devices and has particular reference to means for regulating the supply voltage therefor.

2. Description of the Prior Art

Field effect transistors of the MOS type are particularly desirable for computer applications and the like because of the large number of circuits that can be incorporated on a single substrate. One practical limitation, however, in the number of circuits or packing density which can be provided in a given area is the matter of voltage supply regulation. If the voltage supply can be maintained at an optimum level for the threshold voltage of MOSFETs in a particular integrated circuit or "chip", a maximum number of circuits can be incorporated therein. Otherwise, the individual components of the MOSFETs must be made large enough to accommodate correspondingly greater variations in supply voltage. For example, MOSFETs with a relatively small width to length ratio, i.e. 0.1, must be made longer and those with a relatively large width to length ratio must be made wider.

It has been found that the threshold voltage, (the point at which current flows in an enhancement mode MOSFET device as the bias voltage to the gate is increased) is determined by various factors resulting particularly from the manufacture of the device. For example, the threshold voltage may be determined by the temperature, the depth of the various diffusions, the concentrations of additives, impurities, and imperfections in the silicon crystal forming the substrate of the device. Although such threshold point remains fairly constant throughout any one integrated circuit or "chip", it may vary from chip to chip and often requires discarding of certain chips when the threshold point thereof is outside acceptable limits.

Therefore, the supply voltage of the chip should ideally be adjusted in accordance with the threshold voltage of the circuit thereon so as to remain at an optimum level, regardless of ambient temperature, etc.

MOSFET automatic voltage regulators have been used heretofore as exemplified by the U.S. Pat. No. 3,508,084 to R. W. Warner Jr. However, such regulators are employed in the normal manner to supply a constant voltage to a separate load circuit.

SUMMARY OF THE INVENTION

A principal object of the present invention is to automatically adjust the voltage supply for an integrated circuit embodying a plurality of enhancement mode MOSFET devices in accordance with the threshold voltages of the devices.

Another object is to regulate the voltage supply for a plurality of MOSFET devices on a single substrate in accordance with the collective threshold voltages of such devices.

Another object is to enable a maximum number of MOSFET devices to be incorporated in a given area of an integrated circuit substrate.

A further object is to incorporate the collective threshold voltages of a plurality of MOSFET devices as a reference for an automatic voltage regulating circuit in an integrated circuit.

According to the present invention, a plurality of enhancement mode MOSFET devices forming a voltage regulator are connected in series in the same substrate as the integrated circuits which they are to control. The combined threshold voltage of the voltage regulating MOSFET devices is therefore similar to those of the MOSFET devices on the remainder of the substrate and the combined threshold voltage of such regulating MOSFET devices is used as a reference to control the bias voltage for the remainder of the circuits on the substrate.

The manner in which the above and other objects of the invention are accomplished will be readily understood on reference to the following specification when read in conjunction with the accompanying drawing.

DESCRIPTION OF THE PREFERRED EMBODIMENT

Figure 1:
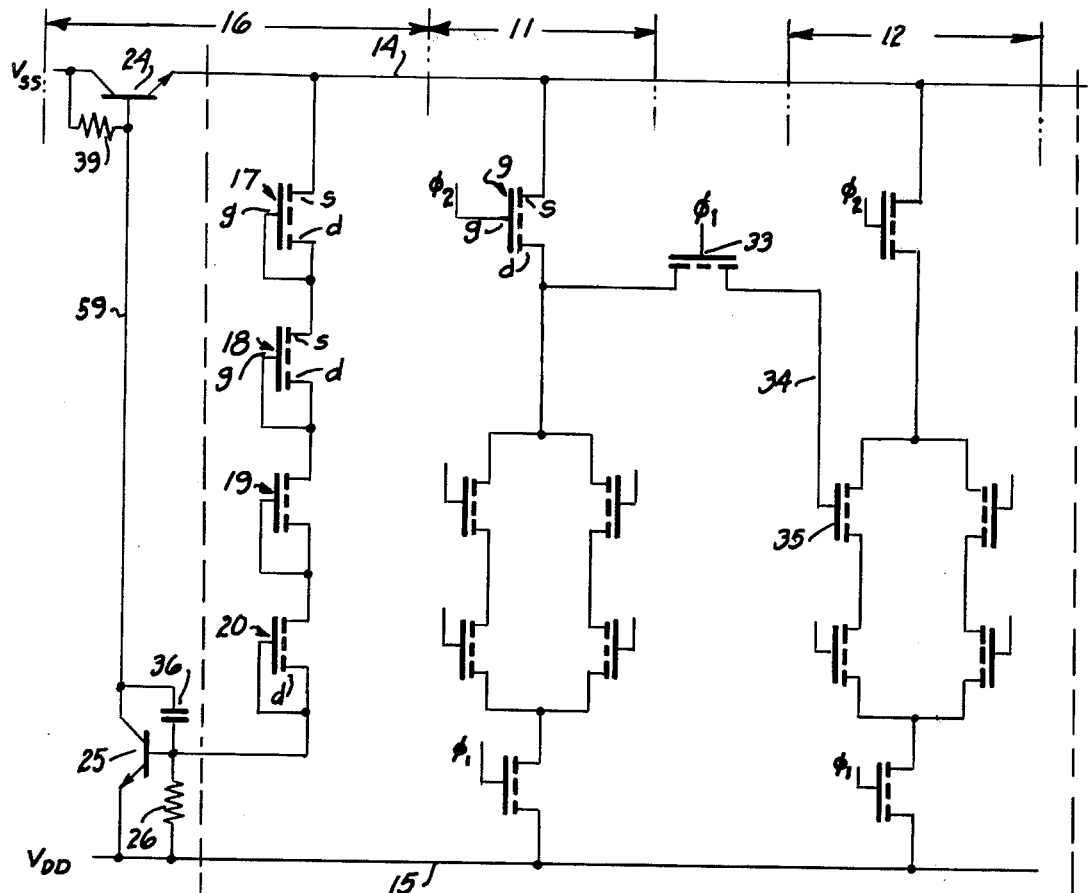
FIG. 1 is a schematic view of a typical elementary integrated circuit of MOSFET devices and embodying a preferred form of the present invention.

Referring to the drawings, FIG. 1 illustrates a schematic diagram of a typical integrated circuit incorporated on a single crystal substrate and including, as an example, a pair of AND/OR gate circuits 11 and 12. Each circuit is made up of a series of enhancement mode MOSFETs, i.e. 9, in series and/or parallel connection and each having a source s, a drain d and a control gate g. It will be noted that each circuit is limited, in the illustrated embodiment, to a maximum of four enhancement mode MOSFETs, in series, although a greater or lesser number could be incorporated. Each circuit is connected across power supply leads 14 and 15. Certain interconnections between the circuits 11 and 12 may exist as exemplified by MOSFET 33 and line 34 connected between the drain of MOSFET 9 and the gate of MOSFET 35.

In accordance with the present invention, a voltage regulator circuit generally indicated at 16, is connected to automatically form a reference voltage in accordance with the combined threshold voltage of a group of four enhancement mode MOSFETs 17, 18, 19 and 20 embodied in the same substrate as the circuits 11 and 12.

It will be noted that the MOSFETs 17 through 20 are connected in series and each has its gate g directly connected to its drain d which is also connected in series with the sources of the succeeding MOSFET.

An NPN regulating transistor 24 has its emitter-collector circuit in series with the power supply line 14 of $V_{SS}$ and its base is connected via line 59 to the collector of an NPN transistor 25 whose emitter is connected to the supply line 15 of $V_{DD}$. The base of transistor 25 is connected to the drain of MOSFET 20 and through a resistor 26 to lead 15. The source of the first MOSFET 17 is connected directly to the supply lead 14. A resistor 39 is connected across the base and collector of transistor 24 to supply base drive current to the latter.

A capacitor 36 is connected across the emitter and collector of transistor 25 to stabilize the feedback loop.

Elements 24, 25, 36 and 39 are discrete components provided external of the substrate.

Accordingly, the threshold characteristics of the MOSFETs 17 through 20, collectively, represent the threshold voltages of the MOSFETs in the remainder of the integrated circuits, i.e. 11 and 12. MOSFETs 17 through 20 are used to control the transistors 25, 24, thereby forming a voltage regulator in which the voltage control is a function of the overall threshold voltages of the MOSFETs 17 through 20, since, as noted heretofore, the threshold voltage generally does not vary throughout a given chip or substrate.

The base-emitter voltage of transistor 25 represents only about 5% of the regulated voltage and can be compensated for by slightly adjusting the sizes of MOSFETs 17 through 20. In any case, the effect of such voltage is negligible.

In the event that the total number of MOSFETs in series in each or any one of the circuits, i.e. 11 and 12, is increased or decreased, the number of series regulating MOSFETs i.e. 17 to 20, would preferably be changed correspondingly.

Figure 2:
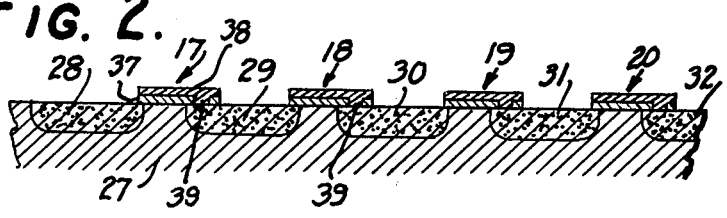
FIG. 2 is a schematic cross section view of the integrated circuit, illustrating the series connected voltage regulating MOSFET devices.

Physically, the voltage regulating MOSFETs 17 through 20 are shown in FIG. 2 as being incorporated in a P-channel enhancement mode MOS structure comprising a silicon semiconductor substrate 27 having a number of doped P-type diffusion regions 28 through 32 formed therein.

Thin dielectric layers 37, typically of silicon oxide, form insulation bridges across the adjacent P-type regions and support metal gate contacts 38, typically of aluminum. Each gate 38 is connected at 39 to the succeeding P-type region to form the series connected regulator MOSFET devices. Thus, the MOSFETs 17 through 20 have their drain to gate capacitances effectively connected serially between lines or busses 14 and 15.

DESCRIPTION OF THE FIRST MODIFIED FORM OF THE INVENTION

Figure 3:
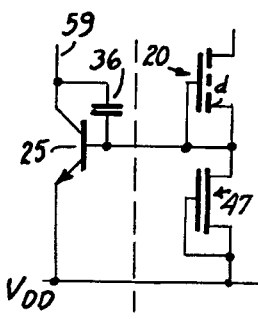
FIG. 3 is a schematic view of a modified form of the invention.

FIG. 3 illustrates a modified form of the invention wherein the resistor 26 of FIG. 1 is replaced by a depletion mode MOSFET 47 embodied in the same substrate as the remaining MOSFET devices, the source of MOSFET 47 being connected to the drain of MOSFET 20.

DESCRIPTION OF THE SECOND MODIFIED FORM OF THE INVENTION

Figure 4:
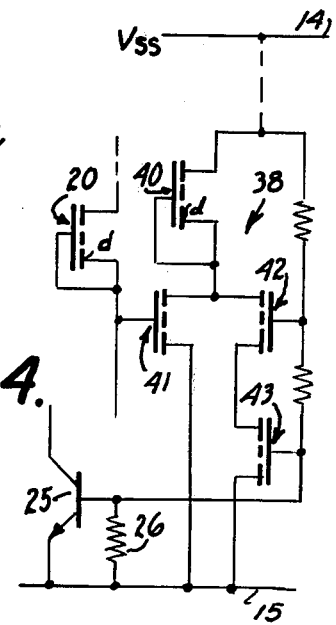
FIG. 4 is a schematic view of another modified form of the invention.

FIG. 4 illustrates a second modified form of the invention in which a non-inverting amplifier 38 is connected between the drain of MOSFET 20 and the base of transistor 25.

Amplifier 38 comprises MOSFET devices 40 through 43 incorporated in the same substrate as the remaining MOSFETs. MOSFET 40 forms a constant current device having its drain connected to the sources of two opposed MOSFETs 41 and 42. The drain of MOSFET 41 is connected directly to the power line $V_{DD}$ while the drain of MOSFET 42 is connected to the source of MOSFET 43 which forms a transistor having its gate connected to the base of transistor 25.

It will be obvious to those skilled in the art that many variations may be made in the exact structure shown without departing from the spirit of this invention. For example, the regulator MOSFETs can be equally well embodied, with obvious modifications, in an N channel enhancement mode MOSFET array. Further, the system could be equally well applied to MOSFETs incorporating silicon gates as well as metal gates. Further, the external transistors 24 and 25 could be incorporated within the integrated circuit, if power requirements for the integrated circuit are sufficiently low.

I claim:

1. An integrated circuit having a plurality of enhancement mode metal oxide semiconductor field effect transistor devices formed on a substrate of semiconductive material and conductors for applying a voltage to said devices, comprising a voltage control device connected to control the voltage applied to said transistor devices through said conductors, a group of additional enhancement mode metal oxide semiconductor field effect transistor devices formed on said substrate, each of said additional devices having a drain, a source, and a control gate connected to said drain;

means connecting the drain of each of said additional devices except the last to the source of a succeeding one of said additional devices, means connecting the source of the first of said additional devices to one of said conductors, and means connecting the drain of the last of said additional devices to said voltage control device whereby to bias said voltage control device in accordance with the combined threshold voltages of said additional devices.

2. An integrated circuit as defined in claim 1 wherein said voltage control device comprises a transistor having a control electrode, said last mentioned means being connected to said control electrode.

3. An integrated circuit as defined in claim 1 wherein the number of said series connected additional devices is equal to the total number of any of said plurality of devices which are connected in series.

4. An integrated circuit having a plurality of enhancement mode metal oxide semiconductor field effect transistor devices formed on a substrate of semiconductive material and a pair of conductors for applying a voltage to said devices, comprising a transistor having its emitter-collector circuit in series between a source of voltage and one of said conductors, a group of additional enhancement mode metal oxide semiconductor field effect transistor devices formed in said substrate, each of said additional devices having a drain, a source, and a control gate connected to said drain;

means connecting the drain of each of said additional devices except the last to the source of a succeeding one of said additional devices, means connecting the source of the first of said additional devices to one of said conductors, and means connecting the drain of the last of said additional devices to the base of said transistor whereby to bias said transistor in accordance with the combined threshold voltages of said additional devices.

5. An integrated circuit as defined in claim 4 wherein said last mentioned connecting means comprises a second transistor having its emitter-collector circuit connected between the base of said first mentioned transistor and the other of said conductors, and means connecting said drain of the last of said additional devices to the base of said second transistor.

6. In an integrated circuit chip of the MOS variety and which includes a plurality of individual, active FET elements, each having a particular conduction threshold defined by a particular threshold voltage and each needing a bias voltage for operation, the chip including a pair of busses to which particular potentials are applied from external sources, the operating voltage for these FET elements being taken from these busses, the improvement of a plurality of FET elements having their drain-to-gate capacitances effectively connected serially between said busses;
  first circuit means included in the chip and connected to monitor whether the voltage on said busses is sufficient to place all of the FET elements of the plurality to the verge of conduction; and
  second circuit means external to the chip and connected to the first circuit means and receiving the potentials as applied from said external source, to control the voltage on said busses in response to deviations from near-conduction of all said FET elements of the plurality as monitored by the first circuit means.

7. In an integrated circuit chip of the MOS variety and which includes a plurality of individual, active FET elements, each having a particular conduction threshold defined by a particular threshold voltage and each needing a bias voltage for operation, the chip including a pair of busses to which particular potentials are applied from external sources, the operating voltage for these FET elements being taken from these busses, the improvement of a plurality of FET elements having their drain-to-gate capacitances interconnected serially so that the resulting circuit establishes the sum of the conduction thresholds of the elements of the plurality as a reference condition; and
  circuit means comprising first circuit means included in the chip and second circuit means external to the chip connected to said busses and to said elements for controlling the voltage between said busses to equal said reference condition.

* * * * *